United States Patent
Yagi et al.

(10) Patent No.: US 8,655,290 B2
(45) Date of Patent: Feb. 18, 2014

(54) ANTENNA WITH BUILT-IN FILTER AND ELECTRONIC DEVICE

(75) Inventors: Shigeru Yagi, Tokyo (JP); Youichi Ushigome, Akishima (JP)

(73) Assignee: Casio Computer Co., Ltd., Tokyo (JP)

( * ) Notice: Subject to any disclaimer, the term of this patent is extended or adjusted under 35 U.S.C. 154(b) by 204 days.

(21) Appl. No.: 13/239,901

(22) Filed: Sep. 22, 2011

(65) Prior Publication Data
US 2012/0077448 A1 Mar. 29, 2012

(30) Foreign Application Priority Data
Sep. 28, 2010 (JP) ................. 2010-216370

(51) Int. Cl.
*H04B 1/04* (2006.01)
*H01Q 1/12* (2006.01)
*H03H 2/00* (2006.01)

(52) U.S. Cl.
CPC .............. *H04B 1/0458* (2013.01); *H03H 2/006* (2013.01)
USPC ........... 455/121; 455/123; 455/286; 455/290; 343/878; 343/722

(58) Field of Classification Search
USPC ......... 455/120, 121, 122, 123, 125, 269, 286, 455/289, 290; 343/722, 822, 878
See application file for complete search history.

(56) References Cited

U.S. PATENT DOCUMENTS

| | | | | |
|---|---|---|---|---|
| 4,334,228 A * | 6/1982 | Johns | ............................ | 343/722 |
| 4,335,386 A * | 6/1982 | Johns | ............................ | 343/722 |
| 5,684,492 A * | 11/1997 | Kagoshima et al. | ... | 343/700 MS |
| 6,112,102 A | 8/2000 | Zhinong | | |
| 6,784,759 B2 * | 8/2004 | Maekawa et al. | ............. | 333/132 |
| 7,023,389 B2 | 4/2006 | Demicco et al. | | |
| 7,043,285 B2 * | 5/2006 | Boyle | ........................ | 455/575.7 |
| 7,132,987 B1 | 11/2006 | Olsson et al. | | |
| 7,746,291 B2 * | 6/2010 | Rofougaran | .................. | 343/861 |
| 7,889,507 B2 | 2/2011 | Ogatsu et al. | | |
| 2002/0027482 A1 * | 3/2002 | Kushitani et al. | ............. | 333/126 |
| 2003/0025572 A1 * | 2/2003 | Maekawa et al. | ............. | 333/132 |
| 2005/0107043 A1 * | 5/2005 | Avasarala et al. | ............... | 455/78 |
| 2006/0017626 A1 | 1/2006 | Kannan et al. | | |
| 2006/0017649 A1 * | 1/2006 | Ooi et al. | ...................... | 343/895 |

(Continued)

FOREIGN PATENT DOCUMENTS

| | | | |
|---|---|---|---|
| EP | 2 026 408 A1 | 2/2009 | |
| GB | 2 450 786 A | 1/2009 | |

(Continued)

OTHER PUBLICATIONS

Korean Office Action dated Oct. 31, 2012 (and English translation thereof) in counterpart Korean Application No. 10-2011-0092829.

(Continued)

*Primary Examiner* — Duc M Nguyen
(74) *Attorney, Agent, or Firm* — Holtz, Holtz, Goodman & Chick, PC

(57) ABSTRACT

An antenna with a built-in filter for use in an electronic device includes: an antenna element; and a circuit board unit connected to the antenna element, wherein the circuit board unit includes: a filter circuit that filters input and output signals of the antenna element; and a matching circuit that performs impedance matching of the antenna element.

9 Claims, 13 Drawing Sheets

(56) References Cited

U.S. PATENT DOCUMENTS

| | | |
|---|---|---|
| 2007/0146212 A1 | 6/2007 | Ozden et al. |
| 2009/0040115 A1 | 2/2009 | Zhang et al. |
| 2009/0167619 A1* | 7/2009 | Yagi .............................. 343/702 |
| 2011/0084886 A1 | 4/2011 | Ogatsu et al. |

FOREIGN PATENT DOCUMENTS

| | | |
|---|---|---|
| JP | 10-093316 A | 4/1998 |
| JP | 2000-174525 A | 6/2000 |
| JP | 2001-144522 A | 5/2001 |
| JP | 2003-513580 A | 4/2003 |
| JP | 2003-283211 A | 10/2003 |
| JP | 2004-040579 A | 2/2004 |
| JP | 2006-033559 A | 2/2006 |
| JP | 2008-227941 A | 9/2008 |
| KR | 10-2000-0048916 A | 7/2000 |
| WO | 98/15028 A1 | 4/1998 |
| WO | WO 02/067379 A1 | 8/2002 |
| WO | WO 2005/022682 A2 | 3/2005 |
| WO | WO 2008/026267 A1 | 3/2008 |
| WO | WO 2008/081077 A1 | 7/2008 |

OTHER PUBLICATIONS

Japanese Office Action dated Aug. 21, 2012 (and English translation thereof) in counterpart Japanese Application No. 2010-216370.
Extended European Search Report (EESR) dated Feb. 6, 2012 (in English) in counterpart European Application No. 11182653.3.

* cited by examiner

ANTENNA WITH BUILT-IN FILTER AND ELECTRONIC DEVICE

CROSS-REFERENCE TO RELATED APPLICATIONS

This application is based upon and claims the benefit of priority from the prior Japanese Patent Application No. 2010-216370, filed on Sep. 28, 2010, the entire contents of which are incorporated herein by reference.

BACKGROUND OF THE INVENTION

1. Field of the Invention

The present invention relates to an antenna with a built-in filter and to an electronic device.

2. Description of Related Art

Heretofore, an electronic device such as a handy terminal and a personal digital assistant (PDA), which has a wireless communication function, has been known. An antenna for wireless communication is mounted on this electronic device.

In some case, the antenna unnecessarily radiates a wave at an unintended frequency depending on a design of a transmission unit for the wireless communication. In order to solve this problem, it is necessary to eliminate such transmission of the unnecessary frequency by changing structures of a transmission circuit and the electronic device. However, it has been difficult to perform such a change for the already fabricated and completed electronic device.

An antenna with a built-in filter has been known, in which, in order to prevent the transmission of the unnecessary frequency, a filter is formed in a stacked dielectric structure to which a radiation element is connected (for example, refer to Japanese Patent Laid-Open Publication No. 2004-40579 and International Publication No. 2002/067379). By this filter, an unnecessary frequency component of a transmission signal is attenuated.

However, when the conventional antenna with the built-in filter is implemented in a small cabinet, the ground and an antenna element come close to each other, a capacitance component therebetween is increased, and it has been apprehended that impedance may be consequently lowered.

SUMMARY OF THE INVENTION

It is an object of the present invention to achieve impedance matching of the antenna with the built-in filter, which is to be implemented in an electronic device.

According to a first aspect of the present invention, there is provided an antenna with a built-in filter, the antenna being implemented in an electronic device, comprising:

an antenna element; and a circuit board unit connected to the antenna element, wherein the circuit board unit includes:

a filter circuit that filters input and output signals of the antenna element; and a matching circuit that performs impedance matching of the antenna element.

According to a second aspect of the present invention, there is provided an electronic device comprising:

an antenna with a built-in filter, the antenna including an antenna element, and a circuit board unit connected to the antenna element, wherein the circuit board unit has a filter circuit that filters input and output signals of the antenna element, and a matching circuit that performs impedance matching of the antenna element;

a wireless communication unit that wirelessly communicates with an external instrument through the antenna with the built-in filter; and a control unit that controls the wireless communication unit.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which.

DESCRIPTION OF THE PREFERRED EMBODIMENT

A description is sequentially made below in detail of a preferred embodiment according to the present invention and a modification example thereof with reference to the accompanying drawings. Note that the present invention is not limited to illustrated examples.

A description is made of the embodiment of the present invention with reference to FIG. 1 to FIG. 12. First, a description is made of a configuration of an entire apparatus of a handy terminal 1 according to this embodiment with reference to FIG. 1 to FIG. 3.

Figure 1:
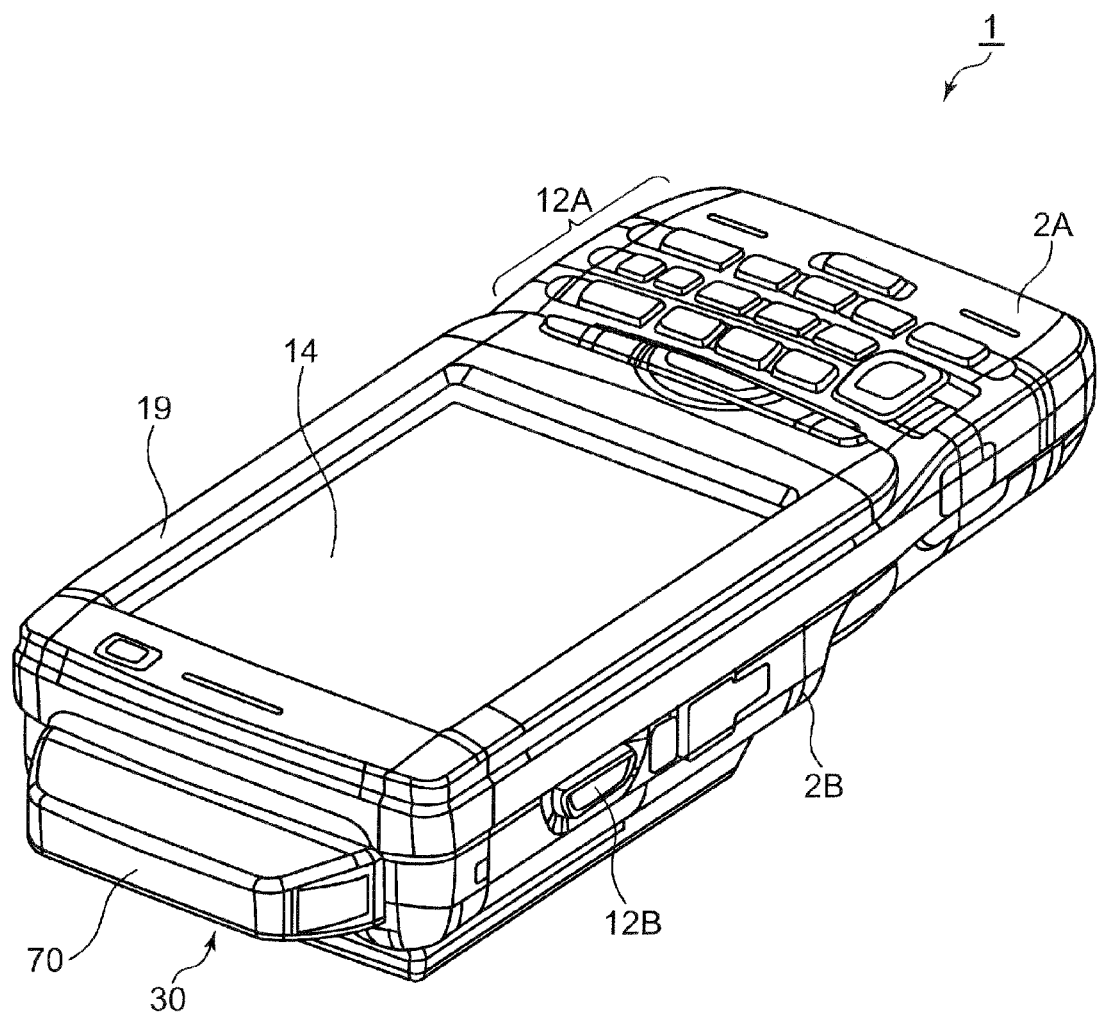
FIG. 1 is a perspective view of a front side of a handy terminal according to an embodiment of the present invention.

FIG. 1 is a perspective view showing a configuration of a front side of a handy terminal 1 according to this embodiment.

Figure 2:
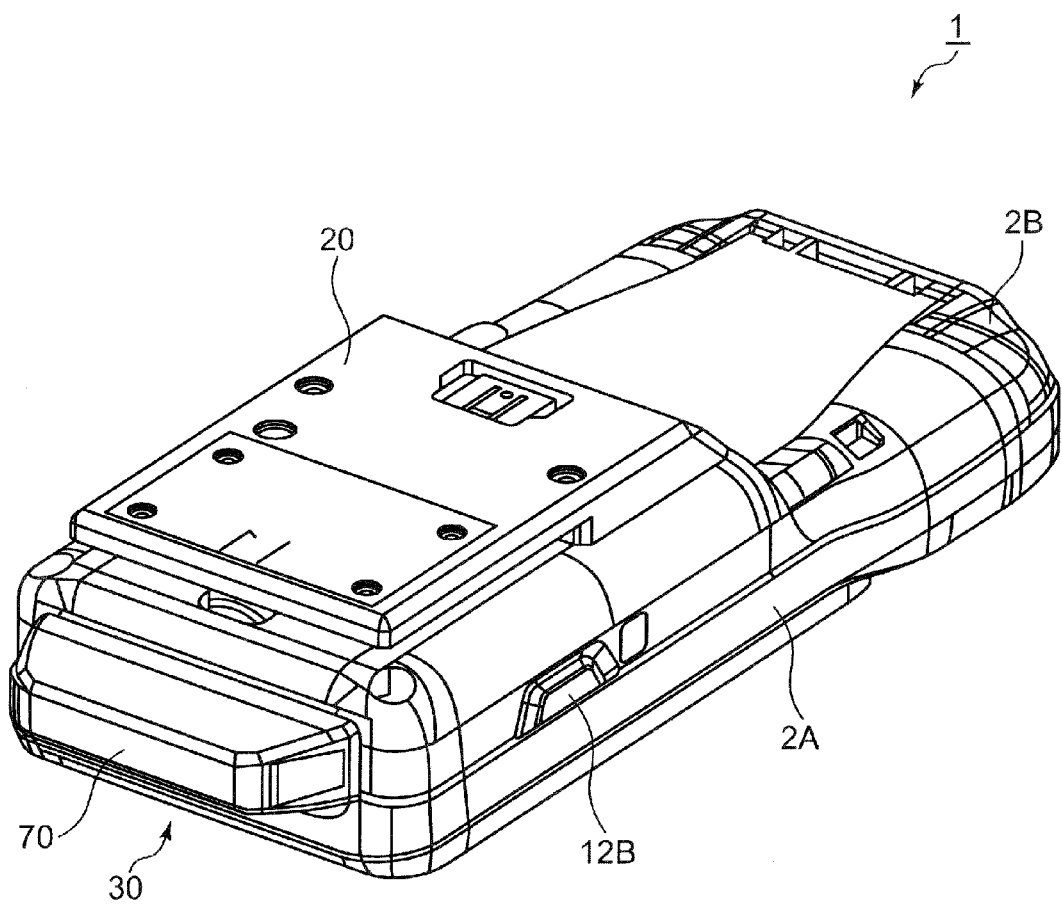
FIG. 2 is a perspective view of a back side of the handy terminal.

FIG. 2 is a perspective view showing a configuration of a back side of the handy terminal 1.

Figure 3:
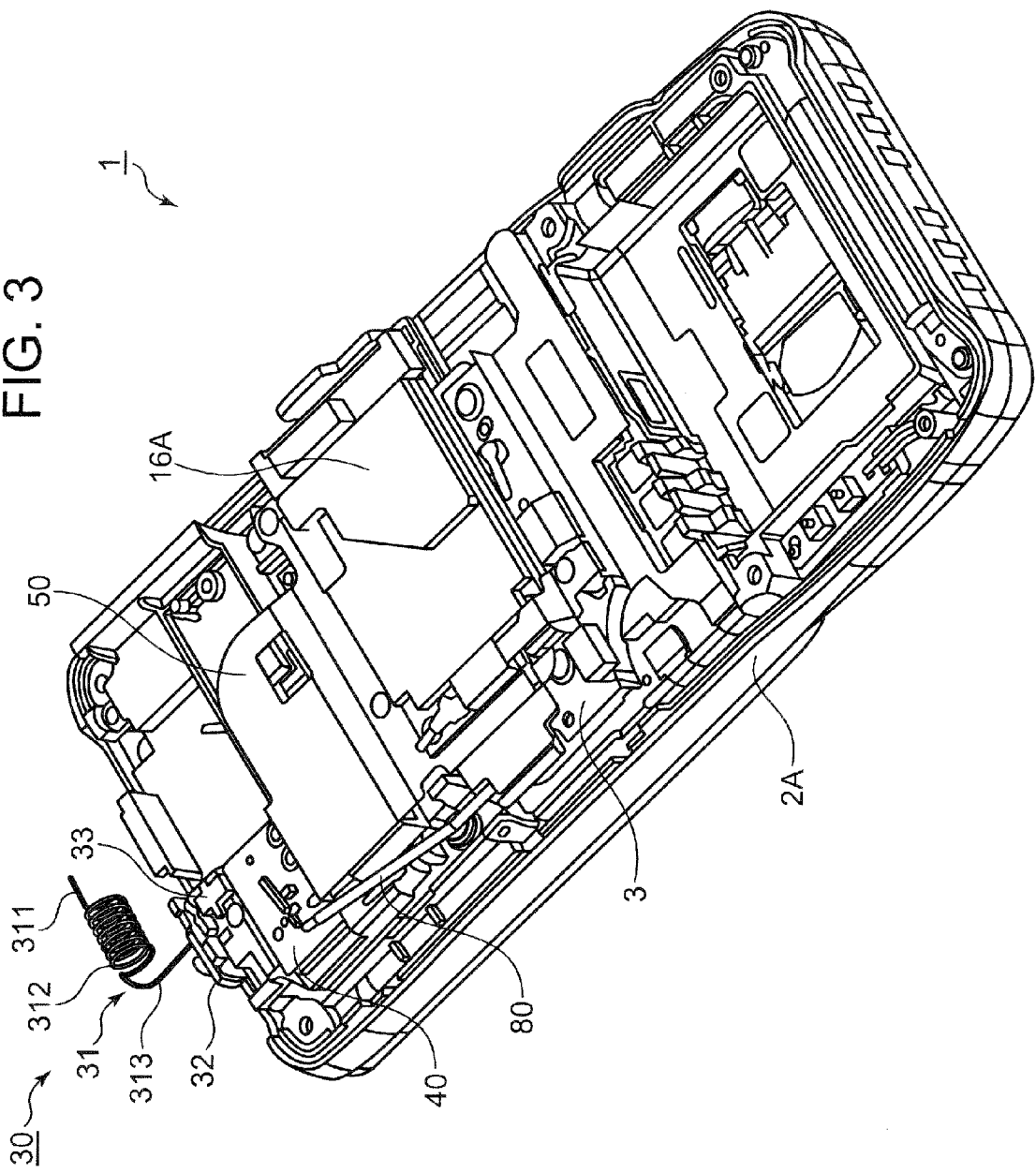
FIG. 3 is a perspective view of the backside of the handy terminal in a state where a case on the back side is detached therefrom.

FIG. 3 is a perspective view showing a configuration of the back side of the handy terminal 1 in a state where a case 2B is detached therefrom.

Figure 4:
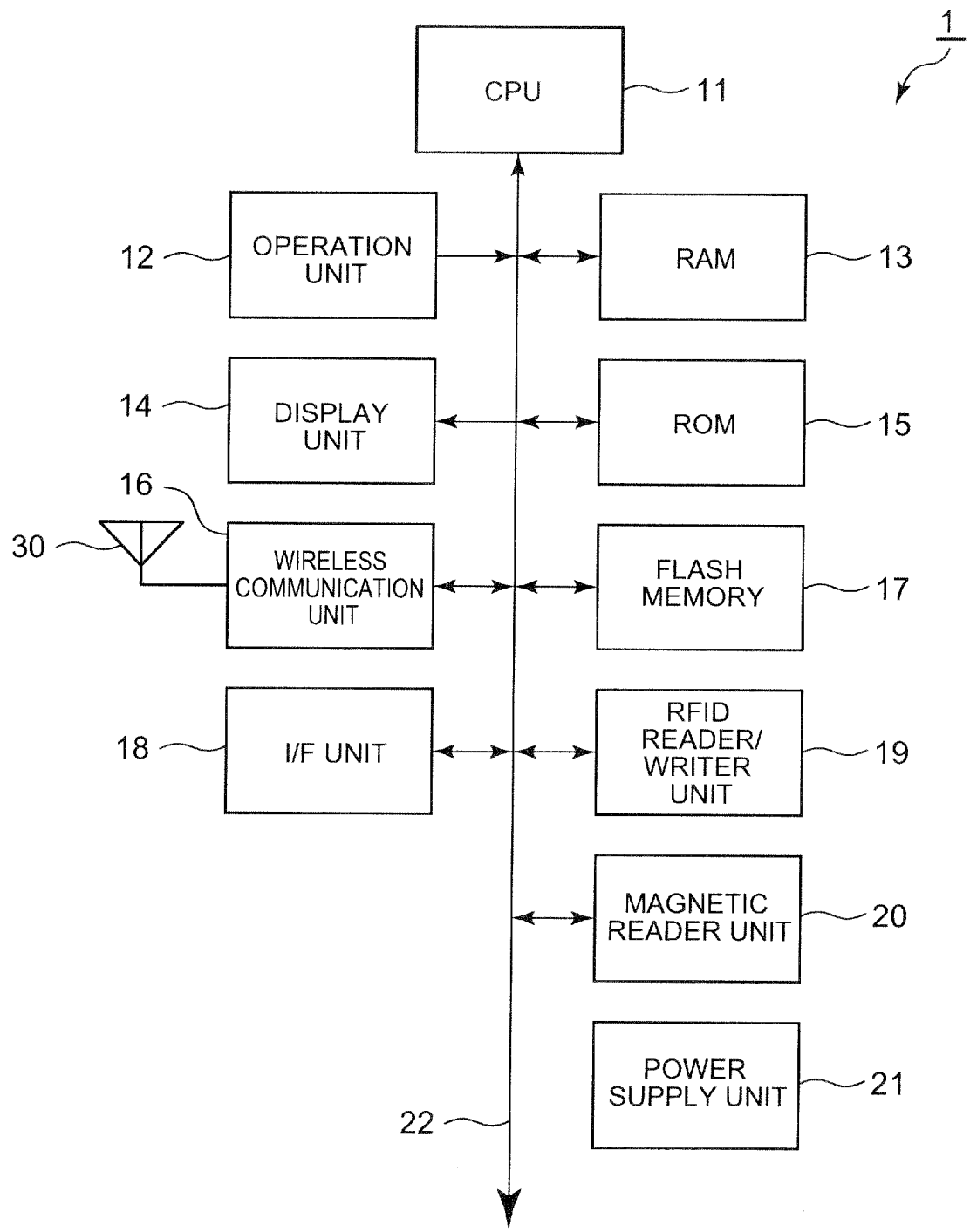
FIG. 4 is a block diagram showing a functional configuration of the handy terminal.

FIG. 4 is a block diagram showing a functional configuration of the handy terminal 1.

The handy terminal 1 as an electronic device of this embodiment is a portable instrument having functions to receive information inputted by an operation of a user, to store the information, to read/write information on radio frequency identification (REID), to capture magnetic information, and so on. Moreover, the handy terminal 1 has a function to communicate with an external instrument through a base station by a telephone line communication mode. It is defined that this telephone line communication mode includes global system for mobile communications (GSM) and wideband code division multiple access (W-CDMA).

As shown in FIG. 1, the handy terminal 1 has cases 2A and 2B as cabinets. On the case 2A on a front side, the handy terminal 1 includes a display unit 14, a variety of keys 12A, and the like. Moreover, the handy terminal 1 includes an antenna 30 with a built-in filter on a tip end of the case 2B on a back side. Moreover, as shown in FIG. 1 and FIG. 2, the handy terminal 1 includes keys 12B on both side surfaces of the case 2B. Furthermore, on the case 2B, the handy terminal 1 includes a magnetic reader unit 20.

The variety of keys 12A are input keys of characters such as numbers, a variety of function keys, and the like. For example, the keys 12B are up and down input keys for moving up and down a cursor displayed on the display unit 14. The cases 2A and 2B are composed of resin and the like.

The display unit 14 performs various displays of an operation screen and the like. A coil antenna is provided in a bezel portion around the display unit 14, and by this coil antenna, an RFID reader/writer unit 19 reads out and writes information in a non-contact IC card and the like, which are brought close to the display unit 14.

The magnetic reader unit 20 is capable of inserting thereinto a capture target such as a credit union passbook having a magnetic storage portion, and captures information stored in the magnetic storage portion of the capture target inserted thereinto. The antenna 30 with the built-in filter is an antenna that performs wireless communication of a cellular phone communication mode. The antenna 30 with the built-in filter has a protruding structure, in which an antenna element 31 to be described later is covered with a cover portion 70, and is allowed to protrude from the cases 2A and 2B.

As shown in FIG. 3, in a state where the case 2B is detached, the handy terminal 1 includes, in an inside of the case 2A: a main board 3; a wireless communication module 16A; a coaxial cable 80; and the antenna 30 with the built-in filter. However, in FIG. 3, in the antenna 30 with the built-in filter, the cover portion 70 and an implementation tool 70, which are to be described later, are omitted.

The main board 3 is a main printed circuit board (PCB) of the handy terminal 1. The wireless communication module 16A is a module for performing the wireless communication of the cellular phone communication mode, and the coaxial cable 80 is connected thereto. The wireless communication module 16A outputs a signal for wireless transmission to the antenna 30 with the built-in filter, and receives a signal wirelessly received from the antenna 30 with the built-in filter.

The antenna 30 with the built-in filter includes: the antenna element 31; an antenna element attachment base portion 32; a connector 33; and a circuit board unit 40. The antenna 30 with the built-in filter is a multiband monopole antenna composed of a wire of metal such as copper. The antenna element 31 has: a tip end portion 311; a trap coil 312; and a connection portion 313.

The tip end portion 311 is a metal wire with a linear shape, which is located at a tip end of the antenna element 31. The trap coil 312 is a metal wire with a coil shape, which is located next to the tip end portion 311. An extended direction of the tip end portion 311 and an axial direction of the trap coil 312 are directions parallel to tip end surfaces of the cases 2A and 2B. The connection portion 313 is a metal wire with a shape bent at 90 degrees, which is located next to the trap coil 312. The connection portion 313 is connected to the antenna element attachment base portion 32.

The antenna element 31 has frequency bands of two resonance frequencies, which are: a resonance frequency corresponding to a length from a connection portion thereof with the antenna element attachment base portion 32 to the tip end thereof; and a resonance frequency corresponding to a length from the connection portion thereof with the antenna element attachment base portion 32 to the trap coil 312.

For example, the frequency band of one of the resonance frequencies covers a communication frequency band of GSM 850 and GSM 900 in the GSM mode and of Band V, Band VI and Band VIII in the W-CDMA mode. The frequency band of the other resonance frequency covers a communication frequency band of GSM 1800 (digital cellular system (DCS) 1800) and GSM 1900 (personal communication service (PCS) 1900) in the GSM mode and of Band I and Band II in the W-CDMA mode.

The antenna element attachment base portion 32 is a PCB onto which the antenna element 31 is attached. The circuit board unit 40 is a PCB, which is connected to the coaxial cable 80 and the connector 33, and in which a filter circuit 44 to be described later and a matching circuit 46 to be described later are formed. The connector 33 is a connector that pin-connects a wire of the circuit board unit 40 to a wire of the antenna element attachment base portion 32. Due to such pin-connection, the antenna element attachment base portion 32 is easily separable (detachable) from the connector 33.

A ground sheet 50 is connected to a ground portion of the circuit board unit 40, and becomes a ground portion of the antenna 30 with the built-in filter. The ground sheet 50 is sandwiched and implemented between the main board 3 and the wireless communication module 16A.

As shown in FIG. 4, the handy terminal 1 includes: a central processing unit (CPU) 11 as a control unit; an operation unit 12; a random access memory (RAM) 13; the display unit 14; a read only memory (ROM) 15; the antenna 30 with the built-in filter; a wireless communication unit 16; a flash memory 17; an interface (I/F) unit 18; the RFID reader/writer unit 19; the magnetic reader unit 20; and a power supply unit 21. The CPU 11, the operation unit 12, the RAM 13, the display unit 14, the ROM 15, the wireless communication unit 16, the flash memory 17, the I/F unit 18 and the RFID reader/writer unit 19 and the magnetic reader 20 are mutually connected to one another through a bus 22.

The CPU 11 controls the respective units of the handy terminal 1. The CPU 11 expands, in the RAM 13, a system program and a program designated from among a variety of application programs, the system program and the variety of application programs being stored in the ROM 15. Then, the CPU 11 executes a variety of processing in cooperation with the program expanded in the RAM 13.

By cooperating with the variety of programs, the CPU 11 receives an input of operation information, which is made through the operation unit 12, reads out a variety of information from the ROM 15, and reads and writes the variety of information from and to the flash memory 17. Moreover, the CPU 11 communicates with the external instrument through the base state by the cellular phone communication mode by the wireless communication unit 16 and the antenna 30 with the built-in filter, reads and writes the information in the non-contact IC card by the RFID reader/writer unit 19, captures the information from the magnetic storage portion of the passbook or the like by the magnetic reader unit 20, and communicates in a wired manner with the external instrument through the I/F unit 18.

The operation unit 12 includes the variety of keys 12A and the keys 12B, and outputs, to the CPU 11, an operation signal of each key to which depression is inputted from an operator. Moreover, the operator 12 may be configured to include a touch pad of a touch pad provided integrally with the display unit 14.

The RAM 13 is a volatile memory that temporarily stores the information. The RAM 13 has a work area that stores the variety of programs to be executed, data related to the variety of these programs, and the like. The display unit 14 is composed of a liquid crystal display (LCD), an electroluminescent display (ELD) or the like, and performs the various displays in accordance with display signals from the CPU 11.

The ROM 15 is a read-only semiconductor memory in which the variety of programs and the variety of data are stored.

The wireless communication unit 16 is connected to the antenna 30 with the built-in filter, and transmits and receives information to and from the base station through the antenna 30 with the built-in filter by the cellular phone communication mode. The wireless communication unit 16 includes the wireless communication module 16A having a modulation unit, a demodulation unit, a signal processing unit and the like. The base station relays the communication between the external instrument and the handy terminal 1. That is to say, the handy terminal 1 can communicate with the external instrument, which is network-connected to the base station, by the wireless communication unit 16 and the antenna 30 with the built-in filter.

The flash memory 17 is a semiconductor memory from and to which information such as the variety of data is readable and writable.

The I/F unit 18 is a wired communication unit, which is wire-connected to an external instrument through a communication cable, and transmits and receives information to and from this external instrument.

The RFID reader/writer unit 19 is a reader/writer unit of an RFID, which performs short-distance wireless communication, which uses an electromagnetic field, with the non-contact IC card or IC tag by the coil antenna provided around the display unit 14, and reads and writes the information stored in the non-contact IC card or IC tag.

The magnetic reader unit 20 includes: an insertion portion into which the passbook and the like are to be inserted; and a header portion located opposite to the magnetic storage portion of the capture target such as the passbook inserted into the insertion portion. The magnetic reader unit 20 magnetically captures, by the header portion, the information stored in the magnetic storage portion of the capture target inserted into the insertion portion, and outputs the captured information to the CPU 11.

The power supply unit 21 is composed of a secondary battery and the like, and supplies a power supply to the respective units of the handy terminal 1.

Subsequently, a description is made in detail of an apparatus configuration of the antenna 30 with the built-in filter with reference to FIG. 5 to FIG. 9.

Figure 5:
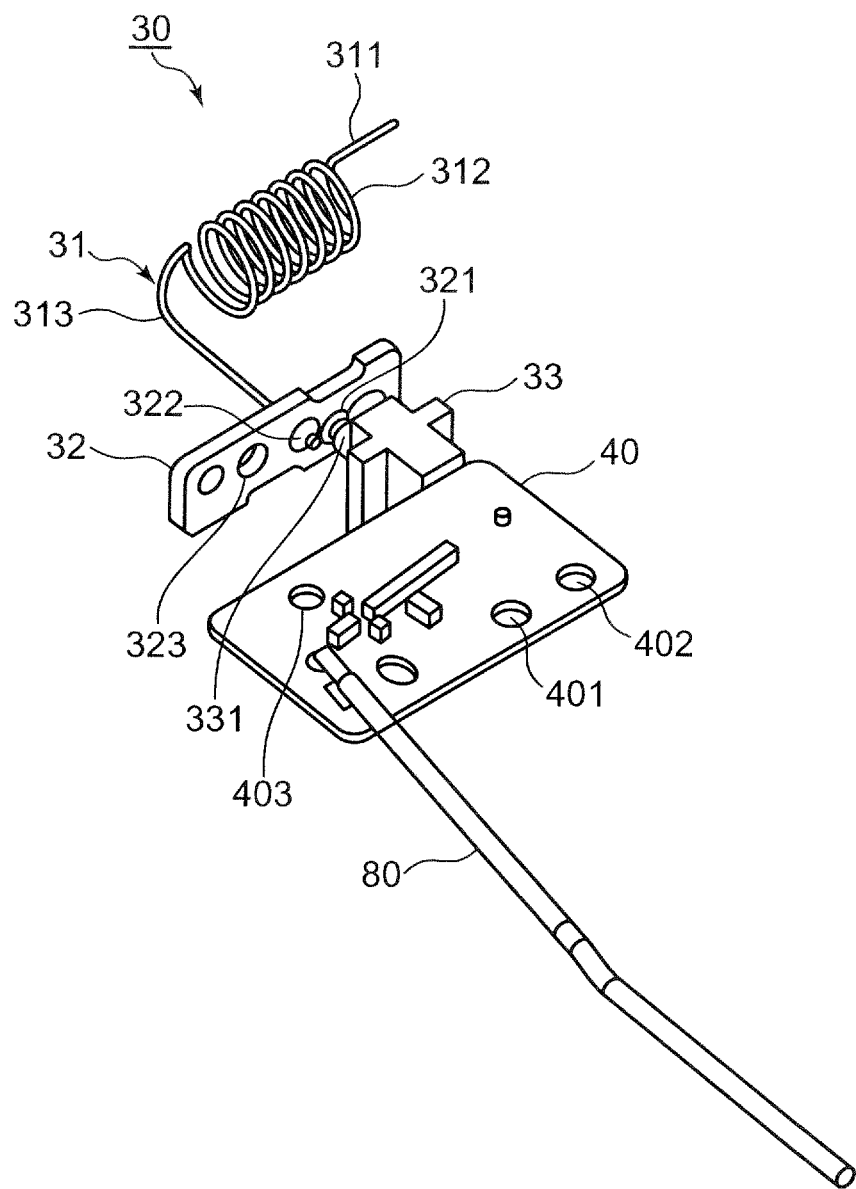
FIG. 5 is a perspective view of a front side of an antenna with a built-in filter.

FIG. 5 is a perspective view showing a configuration of a front side of the antenna 30 with the built-in filter.

Figure 6:
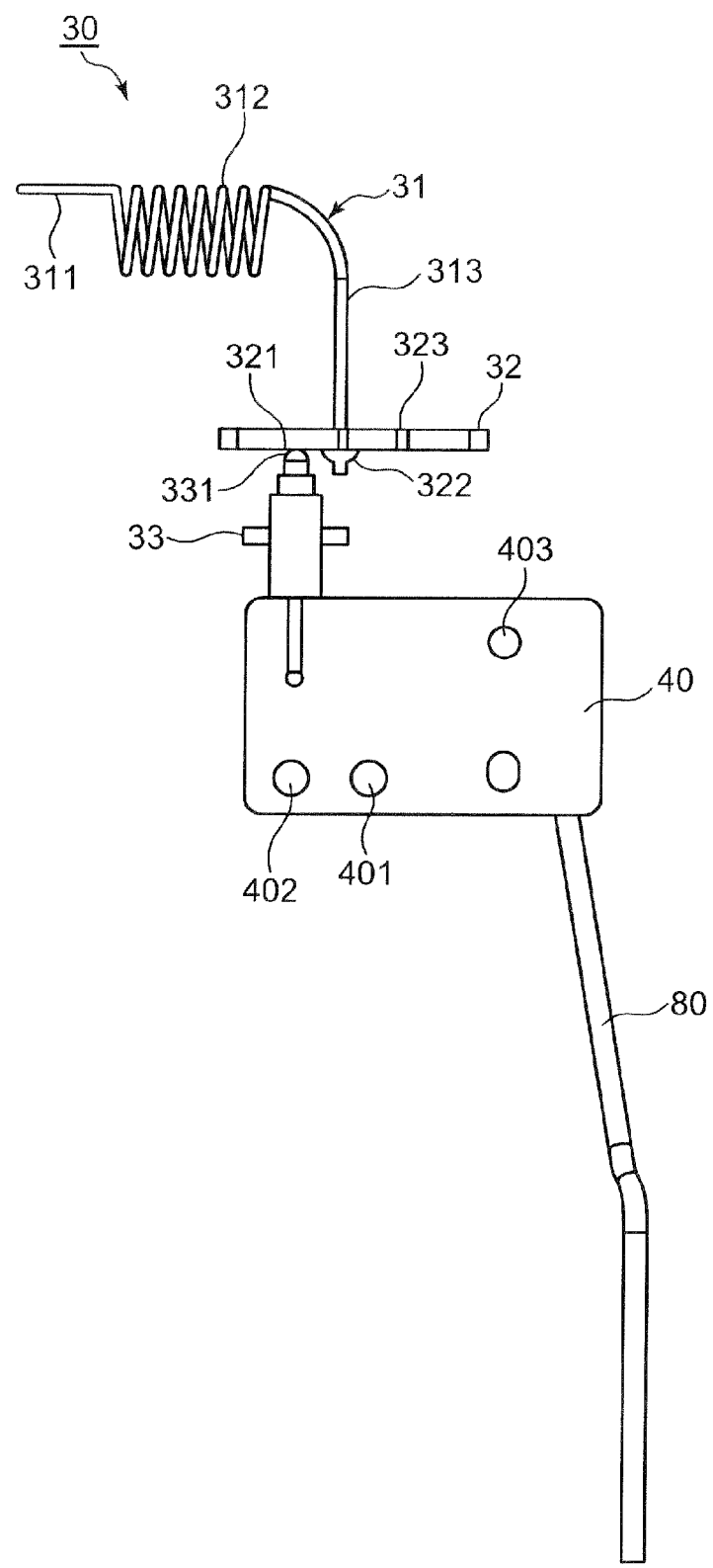
FIG. 6 is a back view of the antenna with the built-in filter.

FIG. 6 is a back view showing a configuration of a back side of the antenna 30 with the built-in filter.

Figure 7A:
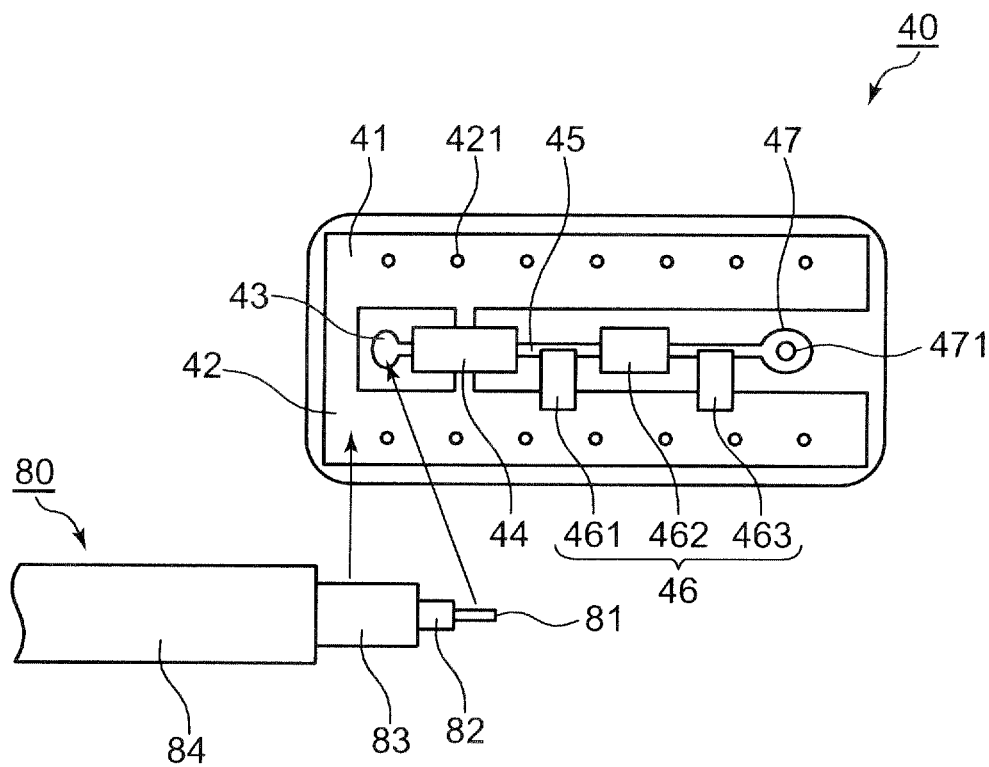
FIG. 7A is a view showing a front surface of a circuit board unit and a coaxial cable.

FIG. 7A is a view showing a configuration of a front surface of the circuit board unit 40 and the coaxial cable 80.

Figure 7B:
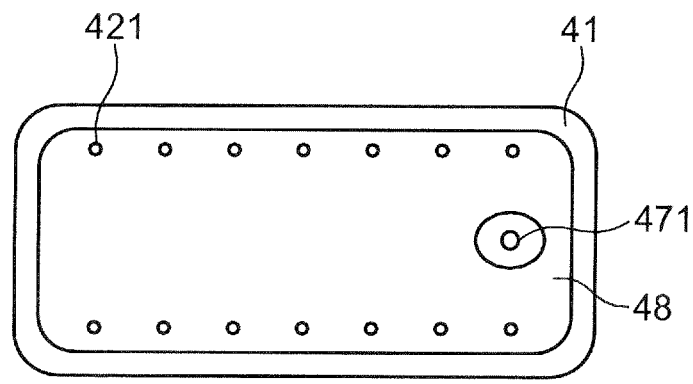
FIG. 7B is a plan view of a back surface of the circuit board unit.

FIG. 7B is a plan view showing a configuration of a back surface of the circuit board unit 40.

Figure 8:
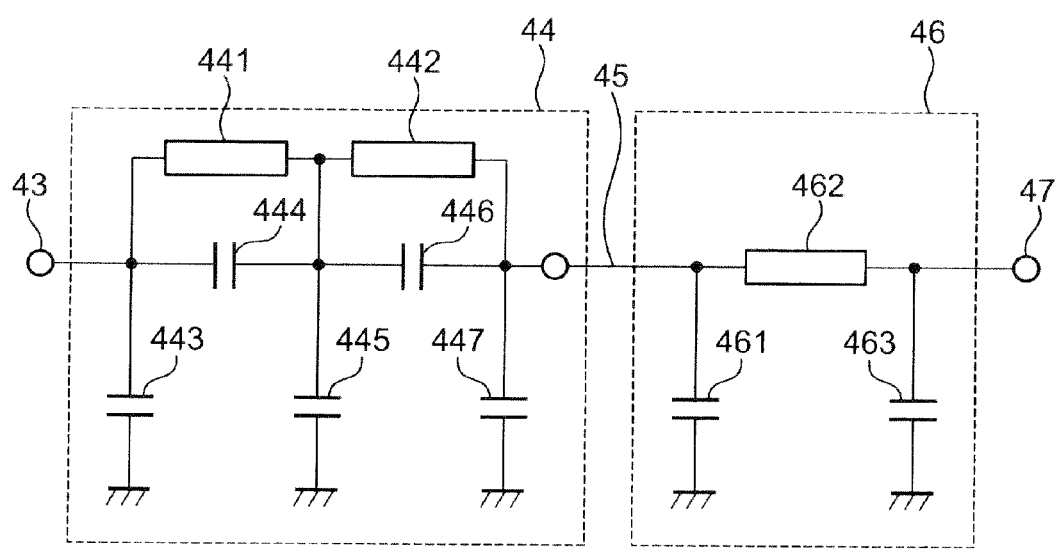
FIG. 8 is a view showing equivalent circuits of a filter circuit and a matching circuit.

FIG. 8 is a view showing equivalent circuits of the filter circuit 44 and the matching circuit 46.

Figure 9:
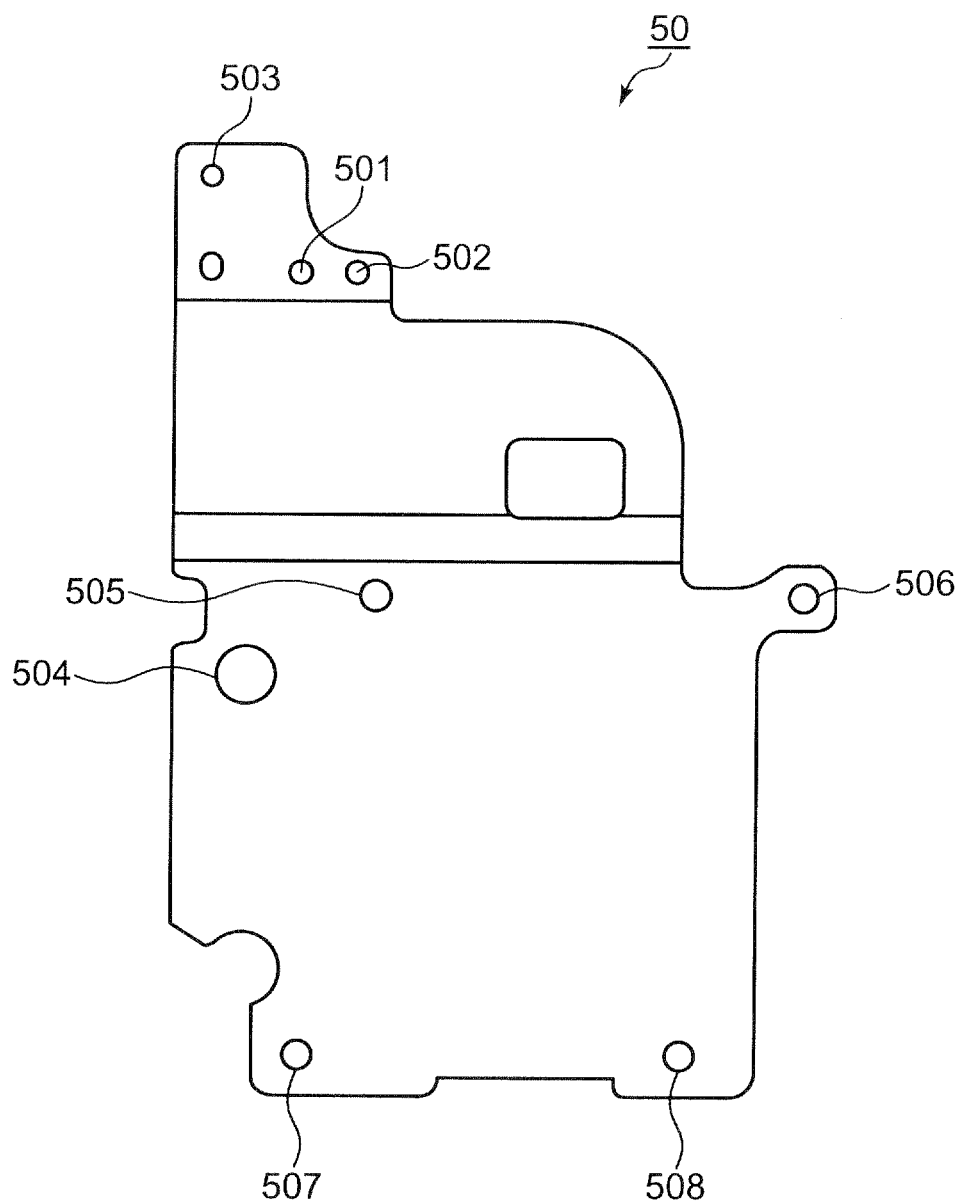
FIG. 9 is a plan view of a ground sheet.

FIG. 9 is a view showing a configuration of the ground sheet 50.

As shown in FIG. 5 and FIG. 6, the antenna 30 with the built-in filter includes: the antenna element 31; the antenna element attachment base portion 32; the connector 33; and the circuit board unit 40. The coaxial cable 80 is electrically connected to the wire of the circuit board unit 40. Moreover, the circuit board unit 40 has screw holes 401, 402 and 403. The screw holes 401, 402 and 403 are screw holes (female screws) for attaching the ground sheet 50 onto the circuit board unit 40 by screws. Moreover, the wire of the circuit board unit 40 is electrically connected to the connector 33.

The connector 33 has a pin contact 331. The antenna element attachment base portion 32 has a contact portion 321 and an antenna element attachment portion 322. The pin contact 331 of the connector 33 is brought into contact with (allowed to abut against) the contact portion 321. In such a way, the wire of the circuit board unit 40 is electrically connected to the contact portion 321 of the antenna element attachment base portion 32 through the connector 33.

The contact portion 321 and the antenna element attachment portion 322 are connected to each other through a wire of the antenna element attachment base portion 322. The antenna element 31 is attached onto the antenna element attachment portion 322 by soldering.

Moreover, the antenna element attachment base portion 32 has a hole 323. The hole 323 is a hole that inserts a screw therethrough, the screw serving for screwing, to a screw hole 201 of the case 2B, an implementation tool 60 to be described later, which implements the antenna element 31 and the antenna element attachment base portion 32.

A description is made in detail of the circuit board unit 40 with reference to FIG. 7A, FIG. 7B and FIG. 8. As shown in FIG. 7A and FIG. 7B, in the circuit board unit 40, a metal pattern is formed on aboard 41, and further, chips are attached thereonto. Note that, in FIG. 7A, and FIG. 7B, the screw holes 401, 402 and 403 of the circuit board unit 40 are not shown. As shown in FIG. 7A, on a front surface of the circuit board unit 40, there are arranged a ground portion 42, a connection portion 43, a filter circuit 44, a wiring portion 45, a matching circuit 46, and a connection portion 47.

The ground portion 42 is a conductor pattern in which a potential is set at the ground potential. The connection portion 43 is a wiring pattern connected to the coaxial cable 80. The filter circuit 44 is a low-pass filter, which allows passage of a frequency component lower than a predetermined frequency of an antenna current, and removes a frequency component higher than the predetermined frequency concerned. The wiring unit 45 is a wiring pattern that connects the filter circuit 44 and the matching circuit 46 to each other.

The matching circuit 46 is a π-type matching circuit that achieves impedance matching of the antenna 30 with the built-in filter (antenna element 31). The matching circuit 46 is a low-pass filter, which allows passage of the component lower than the predetermined frequency of the antenna current, and removes the component higher than the predetermined frequency concerned. The matching circuit 46 includes a capacitor 461, an inductor 462 and a capacitor 463. The capacitors 461 and 463 are chip capacitors. The inductor 462 is a chip inductor. The connection portion 47 is a wiring pattern connected to the connector 33.

Moreover, the coaxial cable 80 is connected to the circuit board unit 40. From a center of a cross section of the coaxial cable 80 (that is, a surface perpendicular to an extended direction thereof) to an outside thereof, the coaxial cable 80 sequentially and concentrically includes: a core wire 81 such as a copper wire; an insulator 82 made of polyethylene or the like; an outer conductor 83 such as a net-like copper wire; and a protective coating portion 84 as an insulator. The core wire 81 on one end of the coaxial cable 80 is connected to the connection portion 43 by soldering. The outer conductor 83 on the same one end is connected to the ground portion 42 by soldering. Such a connection portion between the coaxial cable 80 and the circuit board unit 40 is used as a power feeding point. Moreover, the other end of the coaxial cable 80 is connected to the wireless communication unit 16 (that is, the wireless communication module 16A thereof). High frequency power is fed from the wireless communication unit 16 through the coaxial cable 80 to a power feeding point of the antenna 30 with the built-in filter.

Moreover, the ground portion 42 has through holes 421. Furthermore, the connection portion 47 has a through hole 471. As shown in FIG. 7B, a ground portion 48 and the through hole 471 are arranged on the back surface of the circuit board unit 40. The ground portion 48 is electrically connected to the ground portion 42 on the front surface through the through holes 421. Moreover, the through holes 471 on the back surface are electrically connected to the connection portion 47 on the front surface, and are electrically connected to the connector 33.

As shown in FIG. 8, the filter circuit 44 includes: inductors 441 and 442; and capacitors 443, 444, 445, 446 and 447. The inductors 441 and 442 are chip inductors. The capacitors 443, 444, 445, 446 and 447 are chip capacitors.

The inductors 441 and 442 are connected in series to each other between the connection portion 43 and the wiring portion 45. In a similar way, the capacitors 444 and 446 are connected in series to each other between the connection portion 43 and the wiring portion 45. The capacitor 443 is connected between the ground portion 42 and a node of one ends of the inductor 441 and the capacitor 444 and of the connection portion 43. The capacitor 445 is connected between the ground portion 42 and a node of other ends of the inductor 441 and the capacitor 444. The capacitor 447 is connected between the ground portion 42 and a node of other ends of the inductor 442 and the capacitor 446 and of the wiring portion 45.

The capacitor 461 is connected between the ground portion 42 and a node of one end of the inductor 462 and the wiring portion 45. The inductor 462 is connected in series between the wiring portion 45 and the connection portion 47. The capacitor 463 is connected between the ground portion 42 and a node of other end of the inductor 462 and of the connection portion 47.

In this embodiment, the low-pass filter is used as the filter circuit 44; however, the present invention is not limited to this. For example, a band-pass filter or the like may be used as the filter circuit 44. Moreover, in this embodiment, the π-type matching circuit is used as the matching circuit 46; however, the present invention is not limited to this. For example, other matching circuits such as an L-type matching circuit may be used as the matching circuit 46.

Subsequently, a description is made of a configuration of the ground sheet 50 with reference to FIG. 9.

FIG. 9 is a plan view showing the ground sheet 50.

As shown in FIG. 9, the ground sheet 50 has holes 501, 502, 503, 504, 505, 506, 507 and 508. The holes 501, 502 and 503 are arranged at positions corresponding to the screw holes 401, 402 and 403 of the circuit board unit 40. One screw is inserted through the hole 501 and screwed to the screw hole 401, another screw is inserted through the hole 502 and screwed to the screw hole 402, and still another screw hole is inserted through the hole 503 and screwed to the screw hole 403, whereby the ground sheet 50 is attached to the circuit board unit 40.

The holes 504, 505, 506, 507 and 508 are holes for inserting therethrough screws which screw the wireless communication module 16A and the main board 3 to each other. The wireless communication module 16A is electrically connected to a frame ground of the main board 3 by being screwed thereto by screws through the holes 504, 505, 506, 507 and 508.

The ground sheet 50 has a configuration in which a conductor such as copper foil is formed on an insulator such as polyimide. The screws which pass through the holes 501 and 502 are allowed to conduct to the ground portion 42 of the circuit board unit 40. Accordingly, the conductor of the ground sheet 50 is also set at the ground potential. The circuit board unit 40 and the ground sheet 50 are connected to each other by three screws, and accordingly, connection impedance therebetween can be lowered. Moreover, the ground sheet 50 is sandwiched between the main board 3 and the wireless communication module 16A.

Figure 10:
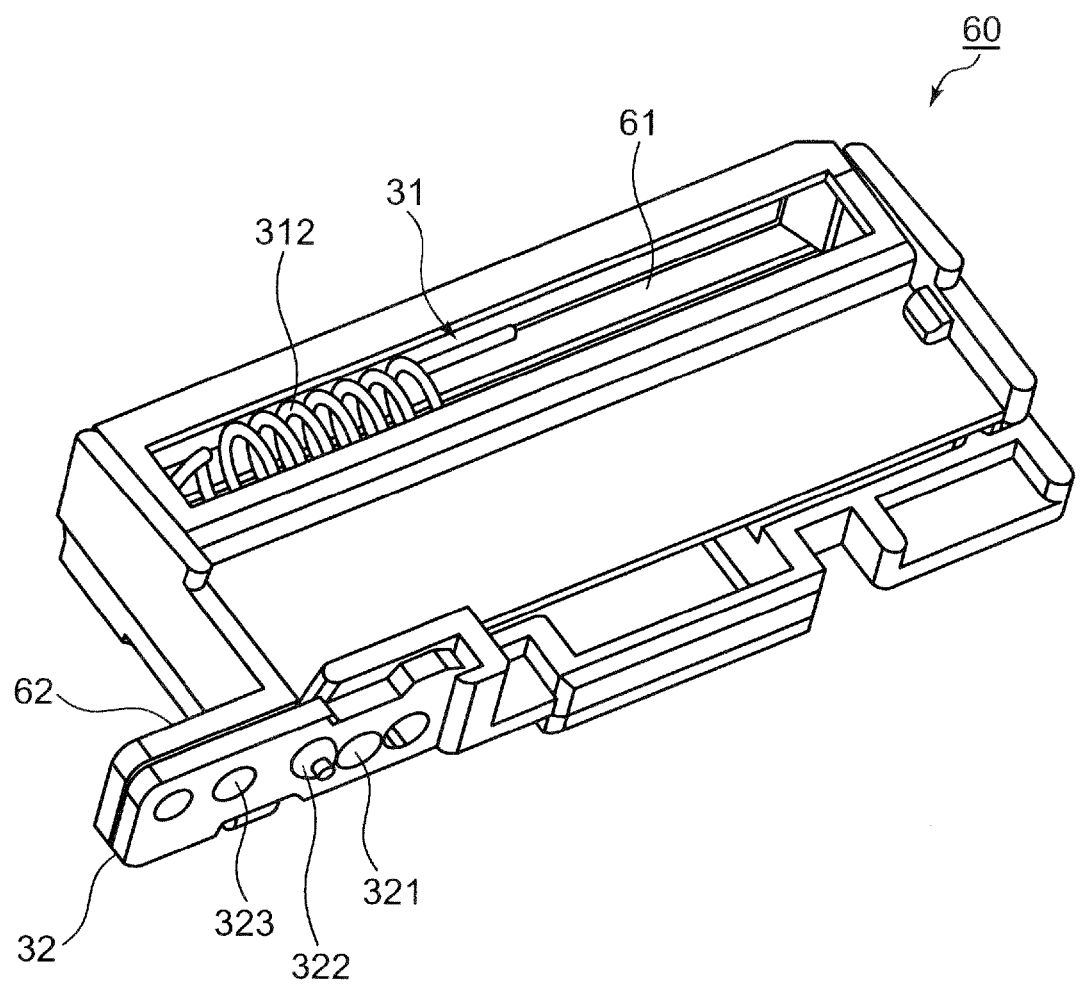
FIG. 10 is a perspective view of an implementation tool.

Subsequently, by referring to FIG. 10, a description is made of the implementation tool 60 that implements the antenna element 31. FIG. 10 is a perspective view showing a configuration of the implementation tool 60.

The antenna 30 with the built-in filter includes the implementation tool 60. The implementation tool 60 is formed of resin or the like, and has an antenna element implementation portion 61 and a hole 62. In the antenna element implementation portion 61, there is implemented (stored) the antenna element 31 in a state of being attached onto the antenna element attachment base portion 32. The hole 62 is a hole that inserts the screw therethrough, the screw serving for screwing the implementation tool 60 to the screw hole 201 of the case 2B.

The antenna element 31 and the antenna element attachment base portion 32 are implemented in the implementation tool 60; however are not fixed thereto. The antenna element 31, the antenna element attachment base portion 32, the connector 33 and the circuit board unit 40 are implemented integrally with one another in the handy terminal 1 in a floating manner.

Figure 11:
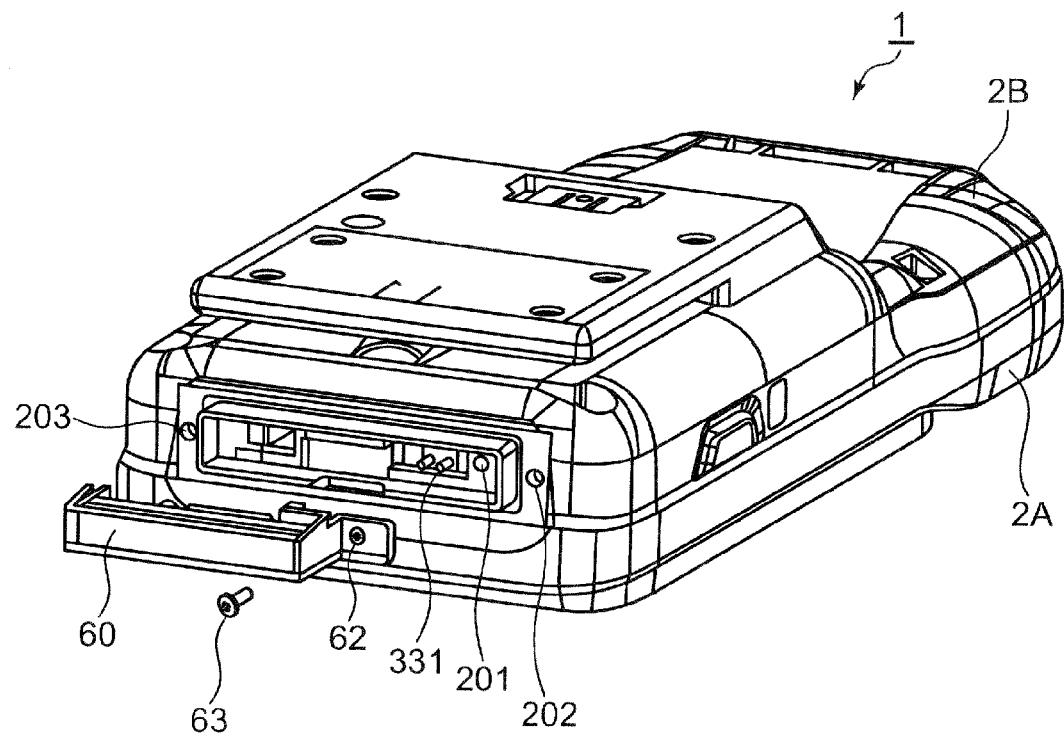
FIG. 11 is a view showing attachment of the implementation tool, in which the antenna with the built-in filter is implemented, to cases.
Figure 12:
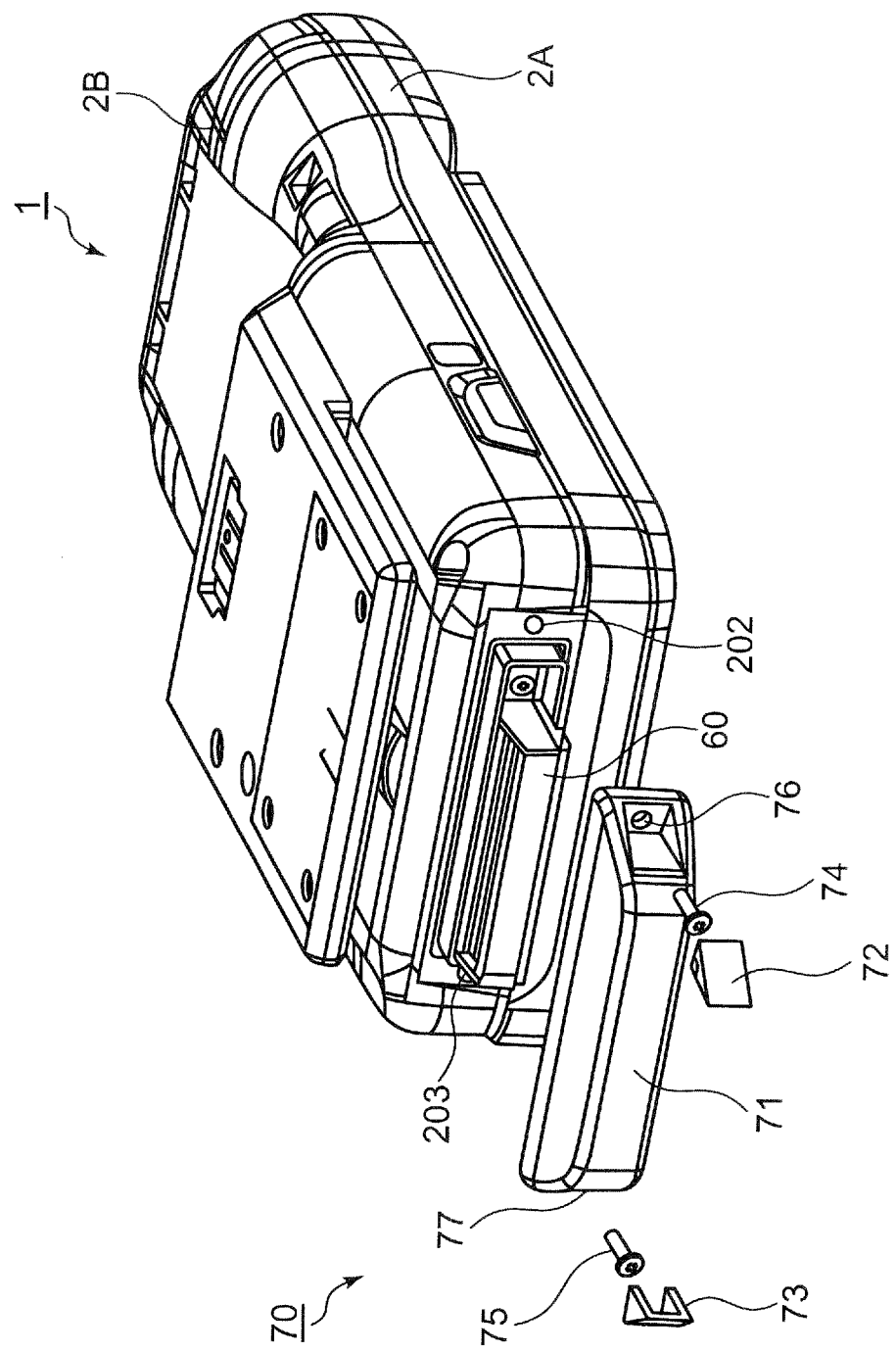
FIG. 12 is a view showing attachment of a cover portion to the cases to which the implementation tool is attached.

Next, by referring to FIG. 11 and FIG. 12, a description is made of an attachment procedure of the antenna 30 with the built-in filter to the cases 2A and 2B.

FIG. 11 is a view showing such attachment of the implementation tool 60, in which the antenna 30 with the built-in filter is implemented, to the cases 2A and 2B.

FIG. 12 is a view showing attachment of the cover portion 70 to the cases 2A and 2B to which the implementation tool 60 is attached.

As shown in FIG. 11, the main board 3 and the variety of internal components, the connector 33 of the antenna 30 with the built-in filter, and the circuit board unit 40 are in a state of being implemented in the cases 2A and 2B of the handy terminal 1. The case 2B has the screw holes 201, 202 and 203.

Moreover, in the implementation tool 60, the antenna element 31 and the antenna element attachment base portion 32 are implemented. Here, a screw (male screw) 63 is inserted through a hole 62 and the hole 323, and is screwed to the screw hole 201. In such a way, the implementation tool 60 in which the antenna element 31 and the like are implemented is attached to the case 2B of the handy terminal 1.

Then, as shown in FIG. 12, the implementation tool 60 is attached to the cases 2A and 2B of the handy terminal 1. The cover portion 70 includes: an implementation tool cover portion 71; screw cover portions 72 and 73; and screws 74 and 75. The implementation cover portion 71 has holes 76 and 77. At this time, the pin contact 331 of the connector 33 is allowed to abut against the contact portion 321 of the antenna element attachment base portion 32, and is electrically connected thereto.

The implementation tool cover portion 71 is a cover portion that covers the implementation tool 60. The screw cover portions 72 and 73 are cover portions which cover the screws 74 and 75. The implementation tool cover portion 71 and the screw cover portions 72 and 73 are formed of resin or the like. Moreover, the case 2B has screw holes 202 and 203. Moreover, the holes 76 and 77 are arranged at positions of the screw holes 202 and 203.

The screw 74 is inserted through the hole 76 and screwed to the screw hole 202. Moreover, the screw 75 is inserted through the hole 77 and screwed to the screw hole 203. Then, the screw cover portions 72 and 73 are fitted to recessed portions where the holes 76 and 77 of the implementation tool cover portion 71 are located. In such a manner as described above, the cover portion 70 is attached to the cases 2A and 2B to which the implementation tool 60 is attached.

As described above, in accordance with this embodiment, the antenna 30 with the built-in filter includes: the antenna element 31; and the circuit board unit 40 connected to the antenna element 31. The circuit board unit 40 includes: the filter circuit 44; and the matching circuit 46.

Therefore, even in the case of the handy terminal 1 with much unnecessary radiation, the unnecessary radiation can be reduced by using the antenna 30 with the built-in filter without modifying the main body of the handy terminal 1, due to the filter circuit 44. In addition, the impedance matching of the antenna 30 with the built-in filter, which is implemented in the handy terminal 1 as a compact electronic device, can be surely achieved, due to the matching circuit 46. In particular, since the connection portion 313 of the antenna element 31 is bent, the impedance becomes smaller than 50Ω; however, the impedance matching can be surely achieved by the matching circuit 46.

Moreover, the antenna 30 with the built-in filter includes: the antenna element attachment base portion 32 onto which the antenna element 31 is attached; and the connector 33 that has the pin contact 331 pin-connected to the antenna element attachment base portion 32. Therefore, the antenna element 31 and the antenna element attachment base portion 32 can be easily detached from the connector 33 (and the circuit board unit 40), and the antenna element 31 and the antenna element attachment base portion 32 can be easily replaced at the repair time.

Moreover, the antenna 30 with the built-in filter includes the implementation tool 60 that implements the antenna element 31 and the antenna element attachment base portion 32 at the position protruding from the cases 2A and 2B as the cabinets of the handy terminal 1. Therefore, an influence from the components such as the main board 3 in the cases 2A and 2B to antenna characteristics of the antenna 30 with the built-in filter can be reduced.

Moreover, the implementation tool 60 is screwed to the case 2B as the cabinet of the handy terminal 1 by the one screw 63. Therefore, the implementation tool 60, the antenna element 31 and the antenna element attachment board portion 32 can be detached from the case 2B and replaced more easily.

Furthermore, in the antenna 30 with the built-in filter, the antenna element 31, the antenna element attachment base portion 32, the connector 33 and the circuit board unit 40 are implemented integrally with one another in the handy terminal 1 in the floating manner. Therefore, an impact onto the antenna 30 with the built-in filter owing to a fall and the like can be absorbed. Moreover, the pin contact 331 is avoided being applied with force by the impact, and a contact failure and a deterioration of the contact can be eliminated.

Moreover, in the antenna 30 with the built-in filter, the wiring portion of the circuit board unit 40 is fed with electric power through the coaxial cable 80. Therefore, the circuit board unit 40 can be arranged at the power feeding point of the antenna 30 with the built-in filter, a structure of the antenna 30 with the built-in filter can be simplified, and the antenna 30 with the built-in filter can be easily manufactured.

Furthermore, the antenna element 31 is the monopole multiband antenna having the trap coil 312. Therefore, multiband wireless communication can be performed, in addition, a structure of the antenna element 31 can be simplified, and the antenna element 31 can be easily manufactured.

Moreover, the antenna 30 with the built-in filter includes the ground sheet 50, which is connected to the ground portion 42 of the circuit board unit 40, and is arranged between the main board 3 and the wireless communication unit 16. Therefore, the connection impedance between the wireless communication module 16A and the frame ground of the main board 3 can be lowered.

Furthermore, the handy terminal 1 includes: the antenna 30 with the built-in filter; the wireless communication unit 16; and the CPU 11. Therefore, the compact handy terminal 1 including the antenna 30 with the built-in filter, the antenna 30 being capable of achieving the impedance matching, can be realized.

Modification Example

Figure 13A:
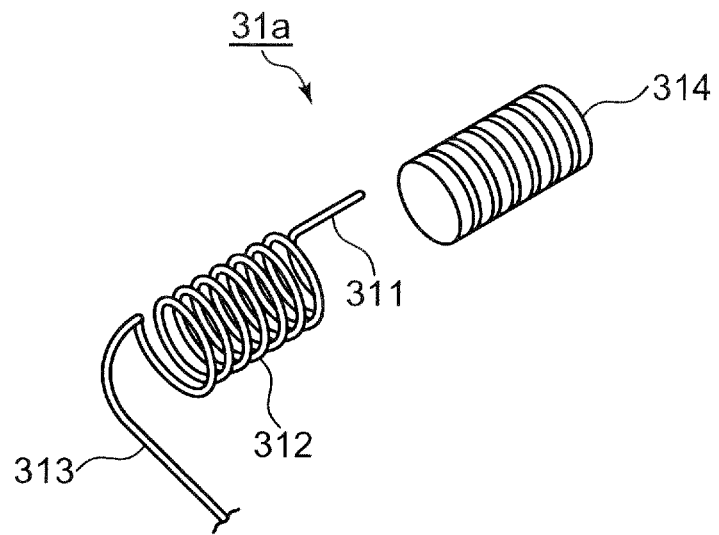
FIG. 13A is a view showing a configuration of an antenna element, from which a bobbin is detached, in a modification example.
Figure 13B:
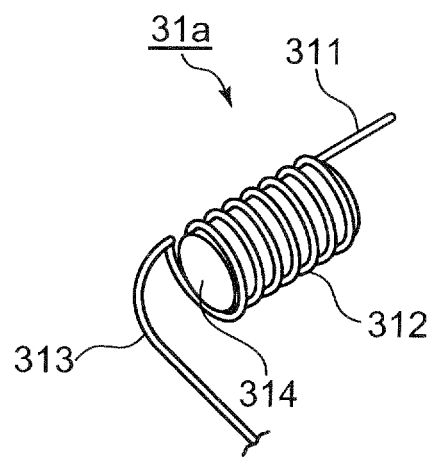
FIG. 13B is a view showing a configuration of the antenna element onto which the bobbin is attached.

A description is made of a modification example of the above-described embodiment with reference to FIG. 13A and FIG. 13B.

FIG. 13A is a view showing a configuration of an antenna element 31a, from which a bobbin 314 is detached, in this modification example.

FIG. 13B is a view showing a configuration of the antenna element 31a onto which the bobbin 314 is attached.

This modification example has a configuration in which, in the handy terminal 1 of the above-described embodiment, the antenna element 31 of the antenna 30 with the built-in filter is replaced by the antenna element 31a. Therefore, a description is only made of the antenna element 31a.

As shown in FIG. 13A, the antenna element 31a has: the tip end portion 311; the trap coil 312; the connection portion 313; and a bobbin 314. The bobbin 314 is composed of resin or the like, has a cylindrical shape corresponding to a hollow portion of the trap coil 312, and has a screw groove formed on a surface thereof.

As shown in FIG. 13B, the bobbin 314 is attached to the hollow portion of the trap coil 312. The trap coil 312 is fitted to the screw groove of the bobbin 314.

As described above, in accordance with this modification example, the antenna with the built-in filter and the handy terminal, which have the antenna element 31a of this modification example, include the bobbin 314 that is attached to the hollow portion of the trap coil 312 and has the screw groove formed thereon. Therefore, similar effects to those of the antenna 30 with the built-in filter and the handy terminal 1 in the above-described embodiment are exerted. In addition, the bobbin 314 can be fixed to the trap coil 312, deformation of the trap coil 312 can be prevented, manufacturing quality of the antenna with the built-in filter can be improved, and management and transportation of the components can be facilitated.

Note that the description in the foregoing embodiment and modification example is merely an example of the antenna with the built-in filter and the electronic device according to the present invention, and the present invention is not limited to this.

Moreover, in each of the foregoing embodiment and modification example, the configuration has been adopted, in which the handy terminal is used as the electronic device having the wireless communication function; however, the present invention is not limited to this. As the electronic device having the wireless communication function, there may be used other electronic devices such as a personal digital assistance (PDA), a cellular phone, a personal handy phone system (PHS) terminal, a net book, and an electronic book reader. Moreover, the electronic device may adopt a configuration including a laser scanner that captures a symbol such as a one-dimensional bar code, or an image scanner.

Furthermore, in each of the foregoing embodiment and modification example, the description has been made of the antenna with the built-in filter, which is the multiband antenna having two communication bands; however, the present invention is not limited to this. A configuration may be adopted, in which, as the antenna with the built-in filter, there is used a single band antenna having one communication band, or a multiband antenna having three or more communication bands. Moreover, the present invention is not limited to the antenna with the built-in filter, which has the antenna element made of the metal wire, and an antenna with a built-in filter, which uses an antenna element with another structure, such as a film antenna, may be used.

Moreover, with regard to detailed configurations and detailed operations of the respective constituent elements of the antenna with the built-in filter and the handy terminal in each of the foregoing embodiment and modification example, as a matter of course, appropriate alterations are possible within the scope without departing from the spirit of the present invention.

What is claimed is:

1. An antenna with a built-in filter for use in an electronic device, the antenna comprising:
   an antenna element;
   an antenna element attachment base portion onto which the antenna element is attached;
   a circuit board unit connected to the antenna element; and
   a connector connected to the antenna element attachment base portion and the circuit board unit;
   wherein the circuit board unit includes:
      a filter circuit that filters input and output signals of the antenna element; and
      a matching circuit that performs impedance matching of the antenna element; and
   wherein the connector includes a pin contact which is pin-connected to a wiring portion of the antenna element attachment base portion.

2. The antenna with a built-in filter according to claim 1, further comprising:
   an implementation tool that implements the antenna element and the antenna element attachment base portion at a position protruding from a cabinet of the electronic device.

3. The antenna with a built-in filter according to claim 2, wherein the implementation tool is screwed to the cabinet of the electronic device.

4. The antenna with a built-in filter according to claim 1, wherein the antenna element, the antenna element attachment base portion, the connector and the circuit board unit are implemented integrally with one another in the electronic device in a floating manner.

5. The antenna with a built-in filter according to claim 1, wherein a wiring portion of the circuit board unit is fed with power through a coaxial cable.

6. The antenna with a built-in filter according to claim 1, wherein the antenna element is a monopole multiband antenna having a trap coil.

7. The antenna with a built-in filter according to claim 6, further comprising:
   a bobbin attached to a hollow portion of the trap coil, the bobbin being formed with a screw groove.

8. The antenna with a built-in filter according to claim 1, further comprising:
   a ground sheet connected to a ground portion of the circuit board unit and arranged between a main board and a wireless communication unit of the electronic device.

9. An electronic device comprising:
   an antenna with a built-in filter, the antenna including an antenna element, an antenna element attachment base portion onto which the antenna element is attached, a circuit board unit connected to the antenna element, and a connector connected to the antenna element attachment base portion and the circuit board unit, wherein the circuit board unit includes a filter circuit that filters input and output signals of the antenna element, and a matching circuit that performs impedance matching of the antenna element, and wherein the connector includes a pin contact which is pin-connected to a wiring portion of the antenna element attachment base portion;
   a wireless communication unit that wirelessly communicates with an external instrument through the antenna with the built-in filter; and
   a control unit that controls the wireless communication unit.

* * * * *